United States Patent
Chao

(10) Patent No.: US 7,994,853 B2
(45) Date of Patent: *Aug. 9, 2011

(54) CLASS-D AMPLIFIER WITH DUAL FEEDBACK LOOP

(75) Inventor: Jao-Chu Chao, Taipei (TW)

(73) Assignee: Eutech Microelectronics Inc., Taipei (TW)

( * ) Notice: Subject to any disclaimer, the term of this patent is extended or adjusted under 35 U.S.C. 154(b) by 55 days.

This patent is subject to a terminal disclaimer.

(21) Appl. No.: 12/562,705

(22) Filed: Sep. 18, 2009

(65) Prior Publication Data

US 2011/0068870 A1    Mar. 24, 2011

(51) Int. Cl.
*H03F 3/38* (2006.01)
(52) U.S. Cl. .......................... 330/10; 330/251
(58) Field of Classification Search ............. 330/10, 330/207 A, 251
See application file for complete search history.

(56) References Cited

U.S. PATENT DOCUMENTS

| 6,998,910 B2 * | 2/2006 | Hezar et al. ............. 330/10 |
| 2007/0069814 A1 * | 3/2007 | Giotta et al. ............. 330/251 |

* cited by examiner

*Primary Examiner* — Robert Pascal
*Assistant Examiner* — Khiem Nguyen
(74) *Attorney, Agent, or Firm* — patenttm.us

(57) ABSTRACT

A class-D amplifier with dual feedback loop scheme has a gain adjusting circuit, a second-order integrator, two comparators, a logic circuit and an output driver. Two differential output terminals of the class-D amplifier are connected to two differential amplifiers of the second-order integrator to construct a second-order feedback loop for offering second order noise shaping, eliminating non-linear components in the class-D amplifier, and also enhancing signal to noise and distortion ratio (SNDR). Further, distortion component existing in the differential signal output from the differential output terminals is amplified by the two differential amplifiers so as to improve the loop gain of the class-D amplifier. The differential signal processed by the two differential amplifiers also can be precisely adjusted.

3 Claims, 9 Drawing Sheets

CLASS-D AMPLIFIER WITH DUAL FEEDBACK LOOP

BACKGROUND OF THE INVENTION

1. Field of the Invention

The present invention relates to a class-D amplifier, and particularly to a class-D amplifier with dual feedback loop.

2. Description of Related Art

Amplifiers can be categorized as class-A amplifiers, class-B amplifiers, AB-class amplifiers and class-D amplifiers. As the development of semiconductor technology, the class-D amplifiers with low power consumption have been applied in widespread applications, such as sound reinforcement system.

In comparison to AB-class amplifiers using linear signals, class-D amplifiers use pulse width modulation (PWM) technique to drive an inductive load device, wherein the PWM technique involves audio signals, PWM switch signals and harmonic signals. The PWM switch signals are applied to alternately turn on and off switching transistors of the class-D amplifier. Because the switches are either fully on or fully off, the power losses in the output devices are significantly reduced to ensure high power efficiency.

With reference to FIG. 5, a conventional class-D amplifier (70) with open loop scheme comprises a gain amplifier (71), a PWM modulator (72), an internal oscillator (73) and an output driver (74).

The gain amplifier (71) has input terminals (Vi+)(Vi−) for receiving an analog audio signal, amplifies the analog audio signal and transmits the amplified audio signal to the PWM modulator (72). Upon the receipt of the amplified audio signal, the modulator (72) refers to an oscillating signal of the internal oscillator (73) to produce PWM signals. The PWM signals controls the output driver (74). The output driver (74) is adapted to connect to an inductive load device (60). The inductive load device (60), for example a speaker, receives the audio signal and restores sound accordingly.

Since the class-D amplifier (70) is configured as an open loop differential structure and the gain amplifier (71) has a differential amplifier (701), random noise floor contributed from the differential amplifier (701) will also be amplified with audio signal. Therefore, when the inductive load device (60) restores the amplified audio signal to sound voice, the sound voice may distort. As a result, the signal to noise and distortion ratio (SNDR) of the class-D amplifier (70) is impacted.

With further reference to FIG. 6, noises (N1) existing in the audio signal can be shaped to higher frequency beyond the signal band, such that the noises (N1) can be eliminated by the low pass characteristic (81) of the low pass filter (80) to retain desired audio data (S1).

With reference to FIG. 7, another conventional class-D amplifier (70a) with close loop scheme has two differential output terminals (Do+)(Do−) and comprises a gain adjusting circuit (711), a first differential amplifier (712), a first-order integrator (75), two comparators (76), a triangle wave oscillator (77), a logic circuit (78) and an output driver (74).

The gain adjusting circuit (711) has input terminals (Vi+)(Vi−) for receiving an analog audio signal.

The differential amplifies (712) is connected to the input terminals (Vi+)(Vi−), and an amplification gain value of the differential amplifies (712) is controlled by the gain adjusting circuit (711).

The first-order integrator (75) comprises a second differential amplifier (751) and two RC circuits. Each of the two RC circuits is connected between one corresponding differential output terminals (Do+)(Do−) and one corresponding input terminals (+)(−) of the second differential amplifier (751). The differential output signal of the class-D amplifier (70a) is feeding back to the second differential amplifier (751) and incorporated with the amplified audio signal output from the first differential amplifier (712).

With further reference to FIG. 8, each comparator (76) has two input terminals, one of the input terminals is connected to a corresponding output terminal (+)(−) of the second differential amplifier (751), and the other input terminal is connected to the triangle wave oscillator (77). Therefore, each comparator will compare the sine wave signal (Vi+)(Vi−) of the first-order integrator (75) with the triangle wave signal (S2) to produce two PWM signals.

The logic circuit (78) is connected to the two comparators (76) to output two driving signals based on the received two PWM signals.

The output driver (74) comprises two half bridge switch circuits (741). The two half bridge switch circuits (741) are controlled by the logic circuit (78) and adapted to drive an inductive load device (60) via the differential output terminals (Do+)(Do−).

Since the class-D amplifier (70a) provides a first-order feedback loop formed by the second differential amplifier (751) and the two RC circuits, the signals to be input to the two comparators (76) are produced by combining an error signal from the second differential amplifier (751), an amplified input audio signal from the first differential amplifier (712), and a real output signal. The amplified input audio signal output from the first differential amplifier (712) contains non-linear components, such as amplifier frequency limitations, amplifier noise, reference voltage noise, gain-bandwidth product limitations and switch device non-linearities. These non-linear components can be eliminated by the first-order feedback loop employing a single integrator.

However, because the class-D amplifier (70a) only uses a single integrator employing a differential amplifier (75) to process the audio signal, the effect of noise rejection the class-D amplifier (70a) through the noise shaping is limited.

To overcome the shortcomings, the present invention provides a class-D amplifier with the dual feedback loop scheme to mitigate or obviate the aforementioned problems.

SUMMARY OF THE INVENTION

An objective of the present invention is to provide class-D amplifier with the dual feedback loop scheme to offer second-order noise shaping and therefore offer good signal to noise and distortion ratio (SNDR).

To achieve the objective, the class-D amplifier with dual feedback loop scheme comprises a gain adjusting circuit, a second-order integrator comprises two integrators, two comparators, a logic circuit and an output driver. The second-order integrator include a first differential amplifier, two first RC circuits, a second differential amplifier and two second RC circuits.

In the class-D amplifier of the present invention, a second-order feedback loop is formed by the differential output terminals, the first differential amplifier and the second differential amplifier to offer higher order noise shaping and efficiently eliminate non-linear components such as amplifier noise of the two differential amplifiers. Therefore, the signal to noise and distortion ratio of the class-D amplifier is improved.

Further, the distortion component of the differential signal output from the differential output terminals can be amplified by the first and second differential amplifiers to enhance the loop gain of the class-D amplifier. After processing by the two differential amplifiers, the differential signal output from the-class amplifier can be precisely modified.

Because the error signal output from the second differential amplifier is incorporated with the output signal of the first second differential amplifier and the feedback signal (high voltage square wave). The non-linear components such as amplifier frequency limitations, amplifier noise, reference voltage noise, gain-bandwidth product limitations and switch device non-linearity can be eliminated by the negative feedback loop. The first differential amplifier is also incorporated into the feedback loop to provide a second-order feedback loop, whereby the class-D amplifier has superior total harmonic distortion plus noise (THD+N).

Another objective of the present invention is to provide a class-D amplifier with reduced electromagnetic interference (EMI).

To achieve the objective, the output driver comprises a first half bridge circuit and a second half bridge circuit. Each half bridge circuit further has a first sub-half bridge circuit and a second sub-half bridge circuit, wherein each sub-half bridge circuit is composed of multiple high-side switches and low-side switches. The number of the high side switches and low side switches of the first sub-half bridge circuit is more than that of the second sub-half bridge. The logic circuit produces four PWM signals X+, X−, Y+ and Y−, wherein the two PWM signals X+ and X− correspond to the two first sub-half bridge circuits respectively, and the other two PWM signals Y+ and Y− correspond to the two second sub-half bridge circuits respectively, where the two PWM signals X+ and X− are expressed by X−=(Y−)-(Y+) and X+=(Y+)-(Y−).

When the differential output terminals of the class-D amplifier has no signal, the duty cycle of the PWM signal (Y+) (Y−) is 50%. Based on the foregoing expressions, the duty cycle of other two PWM signals (X+)(X−) is 0%. As a result, the two first sub-half bridge circuits of the two half bridge circuits are disabled.

When the differential output terminals of the class-D amplifier output the differential signal, only one of the first sub-half bridge circuits is selectively activated. Therefore, the switch loss, the output switch slew rate and the total electromagnetic interference (EMI) are reduced.

Other objectives, advantages and novel features of the invention will become more apparent from the following detailed description when taken in conjunction with the accompanying drawings.

DETAILED DESCRIPTION OF PREFERRED EMBODIMENT

Figure 1:
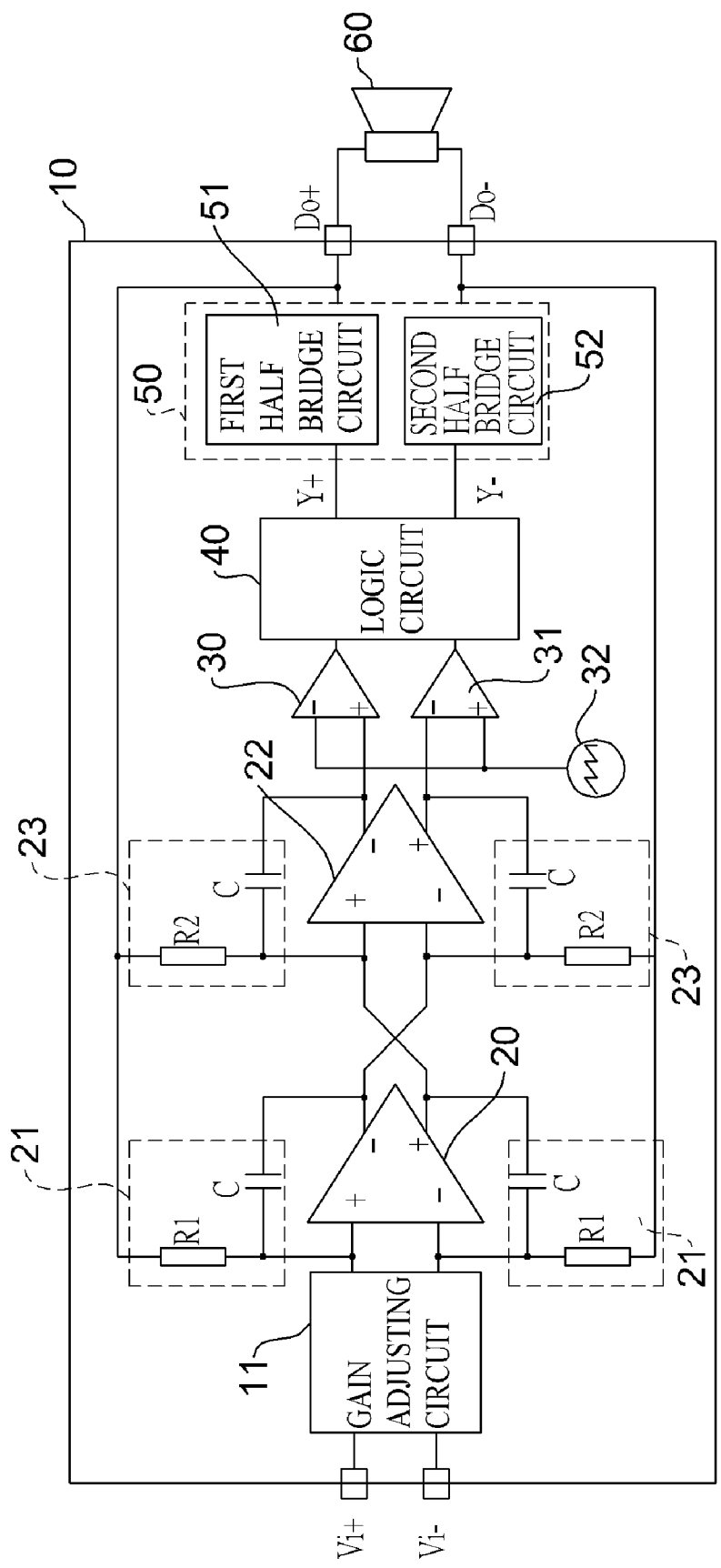
FIG. 1 is a circuit diagram of a first embodiment of a class-D amplifier with dual feedback loop scheme in accordance with the present invention.

With reference to FIG. 1, a class-D amplifier (10) comprises a gain adjusting circuit (11), a second-order integrator, two comparators (30)(31), an oscillator (32), a logic circuit (40), an output driver (50). The output driver (50) comprises a first half bridge circuit (51) and a second half bridge circuit (52), both connected to the logic circuit (40). The first half bridge circuit (51) and the second half bridge circuit (52) provide differential output terminals (Do+)(Do−) of the class-D amplifier (10) respectively.

The second-order integrator comprises a first differential amplifier (20), two first RC circuits (21), a second differential amplifier (22) and two second RC circuits (23).

The first differential amplifier (20) has a non-inverting input (+), an inverting input (−), a non-inverting output (+) and an inverting output (−). The non-inverting input (+) and the inverting input (−) of the first differential amplifier (20) are connected to the gain adjusting circuit (11), so that a differential gain of the first differential amplifier (20) can be adjusted.

One of the first RC circuits (21) is connected between one pseudo differential output terminal (Do+) and the non-inverting input (−) of the first differential amplifier (20), while the other first RC circuit (21) is connected between the other differential output terminal (Do−) and the inverting input (−) of the first differential amplifier (20). The two first RC circuits (21) cooperate with the first differential amplifier (20) to form two first-order integrating circuits.

The second differential amplifier (22) has a non-inverting input (+), an inverting input (−), a non-inverting output (+) and an inverting output (−). The non-inverting input (+) of the second differential amplifier (22) is correspondingly connected to the non-inverting output (+) of the first differential amplifier (20). The inverting input (−) of the second differential amplifier (22) is correspondingly connected to the inverting output (−) of the first differential amplifier (20).

One of the second RC circuits (23) is connected between one pseudo differential output terminal (Do+) and the non-inverting input (−) of the second differential amplifier (22), while the other second RC circuit (23) is connected between the other differential output terminal (Do−) and the inverting input (−) of the second differential amplifier (22). The two second RC circuits (23) cooperate with the second differential amplifier (22) to form two second-order integrating circuits.

In the class-D amplifier (10), a second-order feedback loop is formed by the differential output terminals (Do+)(Do−), the first differential amplifier (20) and the second differential amplifier (22) to offer higher order noise shaping (−40 dB/dec) and efficiently eliminate non-linear components such as amplifier noise of the two differential amplifier (20)(22). Therefore, the signal to noise and distortion ratio (SNDR) of the class-D amplifier can be improved.

Further, distortion component of the differential signal output from the differential output terminals (Do+)(Do−) can be amplified by the first and second differential amplifiers (20)(22) so as to enhance the loop gain of the class-D amplifier (10). The differential signal processed by the two differential amplifiers (20)(22) also can be precisely adjusted.

Further, the error signal output from the second differential amplifier (22) is incorporated with the output signal of the first second differential amplifier (20) and the feedback signal (high voltage square wave). The non-linear components such as amplifier frequency limitations, amplifier noise, reference voltage noise, gain-bandwidth product limitations can be eliminated by negative feedback loop constructed by the second differential amplifier (22), the second RC circuits (23) and the differential output terminals (Do+)(Do−). The first differential amplifier (20) is also incorporated into the feedback loop to provide a second-order feedback loop, whereby the class-D amplifier (10) has superior total harmonic distortion plus noise (THD+N).

Figure 2:
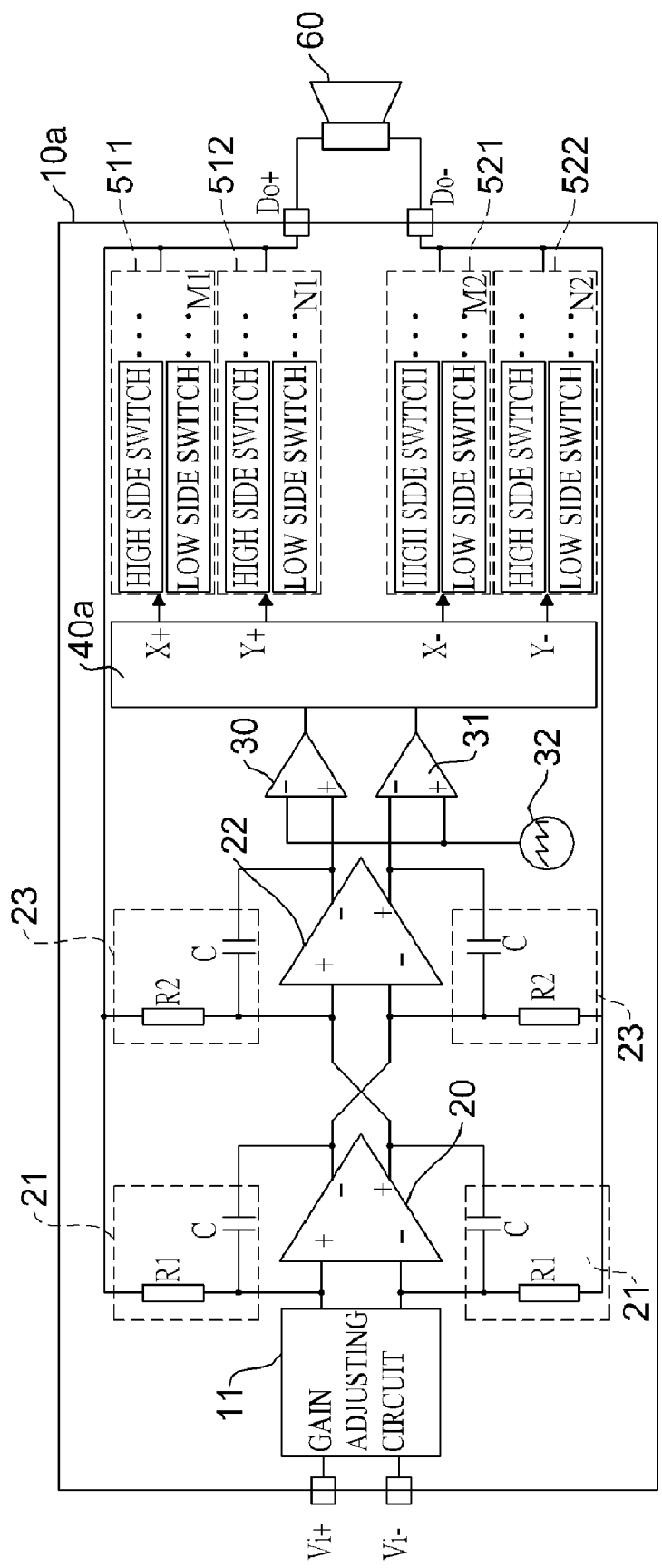
FIG. 2 is a circuit diagram of a second embodiment of the class-D amplifier with dual feedback loop scheme in accordance with the present invention.

With reference to FIG. 2, the first half bridge circuit (51) further comprises a first sub-half bridge circuit (511) and a second sub-half bridge circuit (512). Similarly, the second half bridge circuit (52) also has a first sub-half bridge circuit (521) and a second sub-half bridge circuit (522). Each of the sub-half bridge circuits (511) (512) (521) (522) is consisted of multiple high-side switches and low-side switches. The numbers (M1) (M2) of the high-side switches and the low-side switches in each first sub-half bridge circuit (511) (521) are preferably more than three to five times those (Ni) (N2) of the second sub-half bridge circuit (512) (522).

The logic circuit (40a) outputs four PWM signals (X+) (Y+)(X−)(Y−), wherein the two PWM signals (X+)(X−) correspond to the two first sub-half bridge circuits (511)(521) respectively, and the other two PWM signals (Y+)(Y1) correspond to the two second sub-half bridge circuits (512)(522) respectively. Logic expressions of the two PWM signals (X+) (X−) are X−=(Y−)−(Y+); X+=(Y+)−(Y−).

Figure 3A:
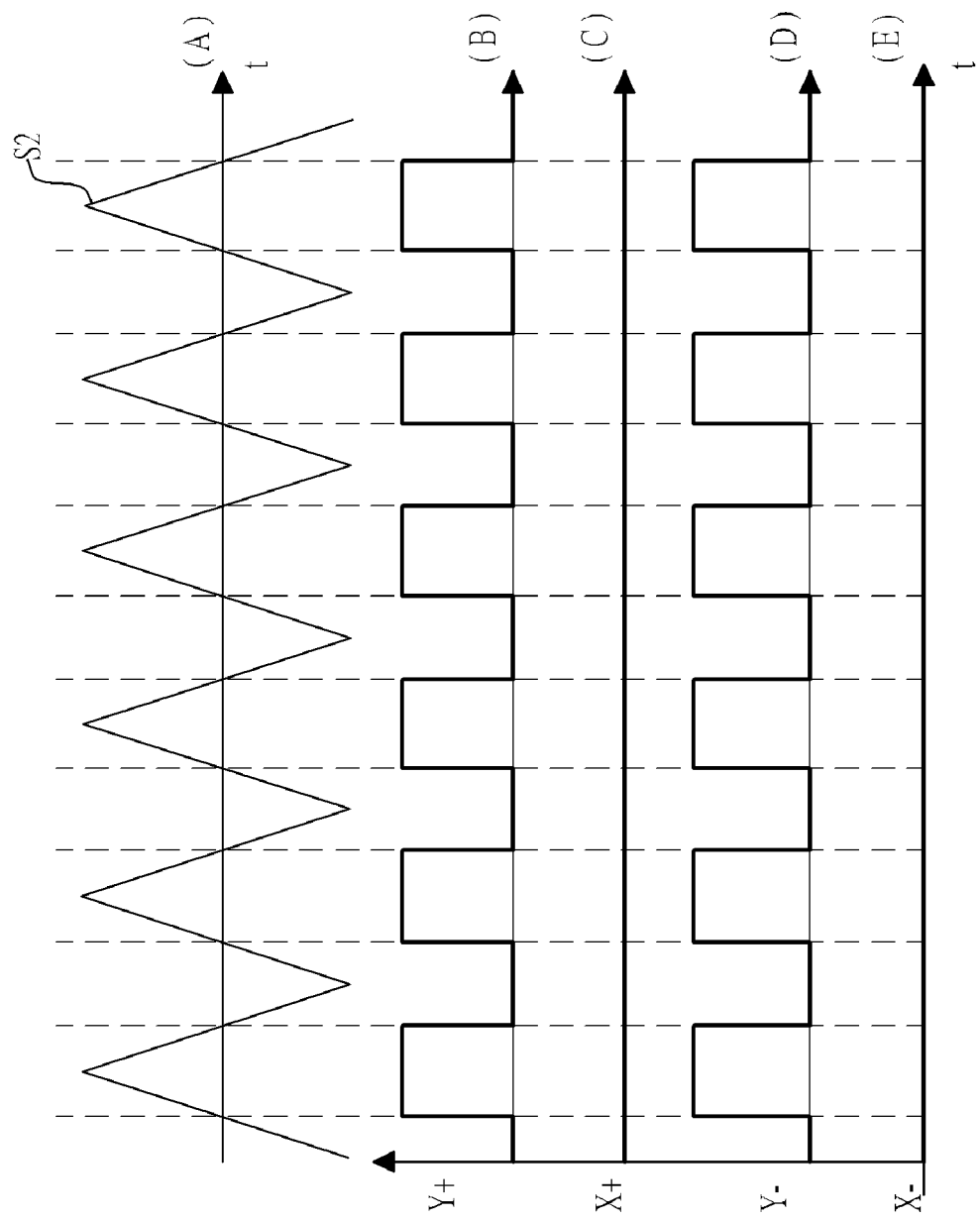
FIG. 3A is a waveform diagram illustrating multiple signals of the class-D amplifier of FIG. 2 when the class-D amplifier has no output signals.

With reference to FIG. 3A, when the differential output terminals (Do+, Do−) of the class-D amplifier (10a) has no signal, the two PWM signals (Y+)(Y−) have 50% duty cycle. Based on the foregoing expressions, the other two PWM signals (X+)(X−) have 0% duty cycle. As a result, the first sub-half bridge circuits (511)(521) of the two half bridge circuits (51)(52) are disabled.

Figure 3B:
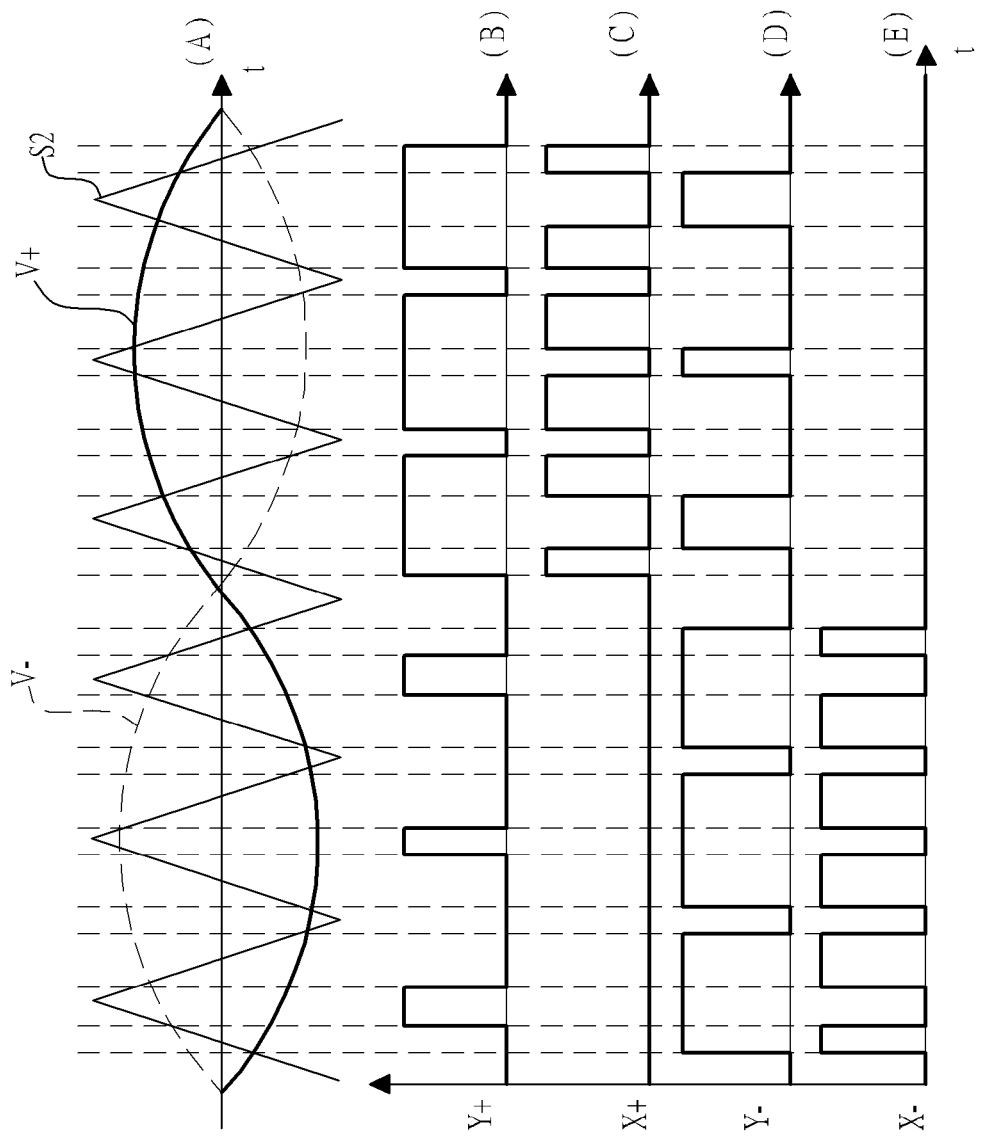
FIG. 3B is a waveform diagram illustrating multiple signals of the class-D amplifier of FIG. 2 when the class-D amplifier has output signals.

With reference to FIG. 3B, when the differential output terminals (Do+, Do−) of the class-D amplifier (10a) output the differential signal, only one of the first sub-half bridge circuits (511)(521) is selectively activated. Therefore, the switch loss and the output switch slew rate of the output driver (50) are reduced. The total electromagnetic interference (EMI) of the class-D amplifier (10b) also can be improved.

Figure 4:
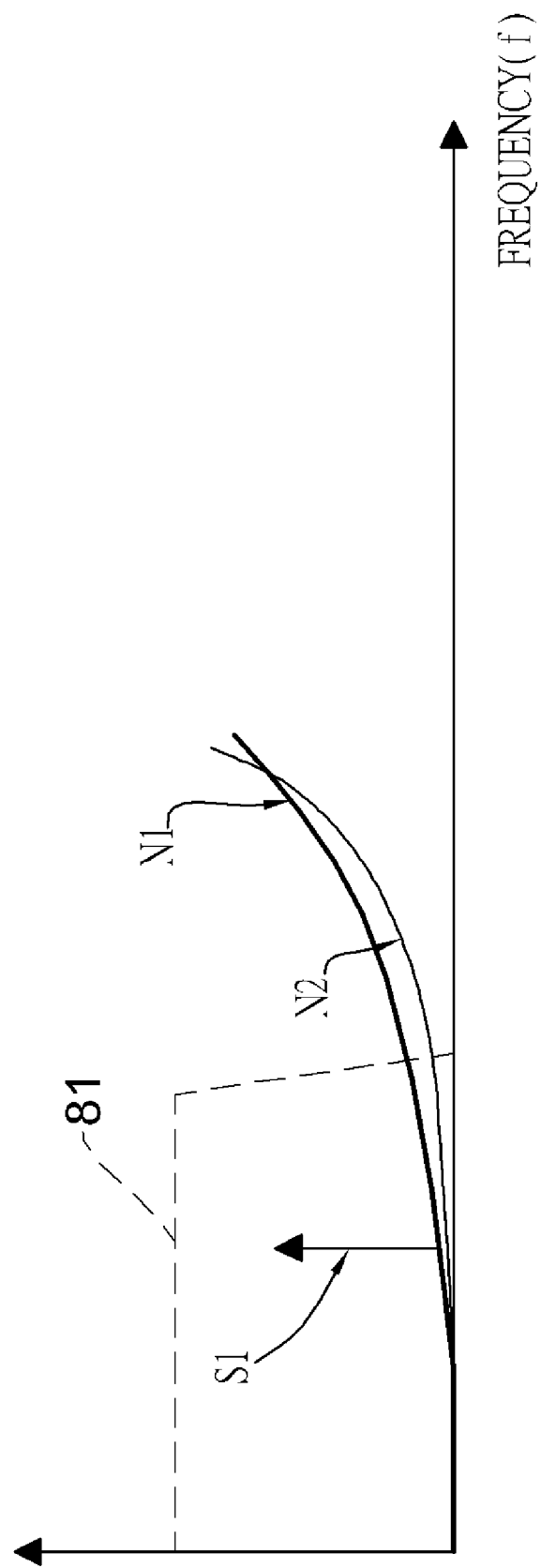
FIG. 4 is a diagram illustrating power spectrum of an amplified audio signal, showing processed results by a first-order feedback loop (N1) and a second-order feedback loop (N2)
Figure 5:
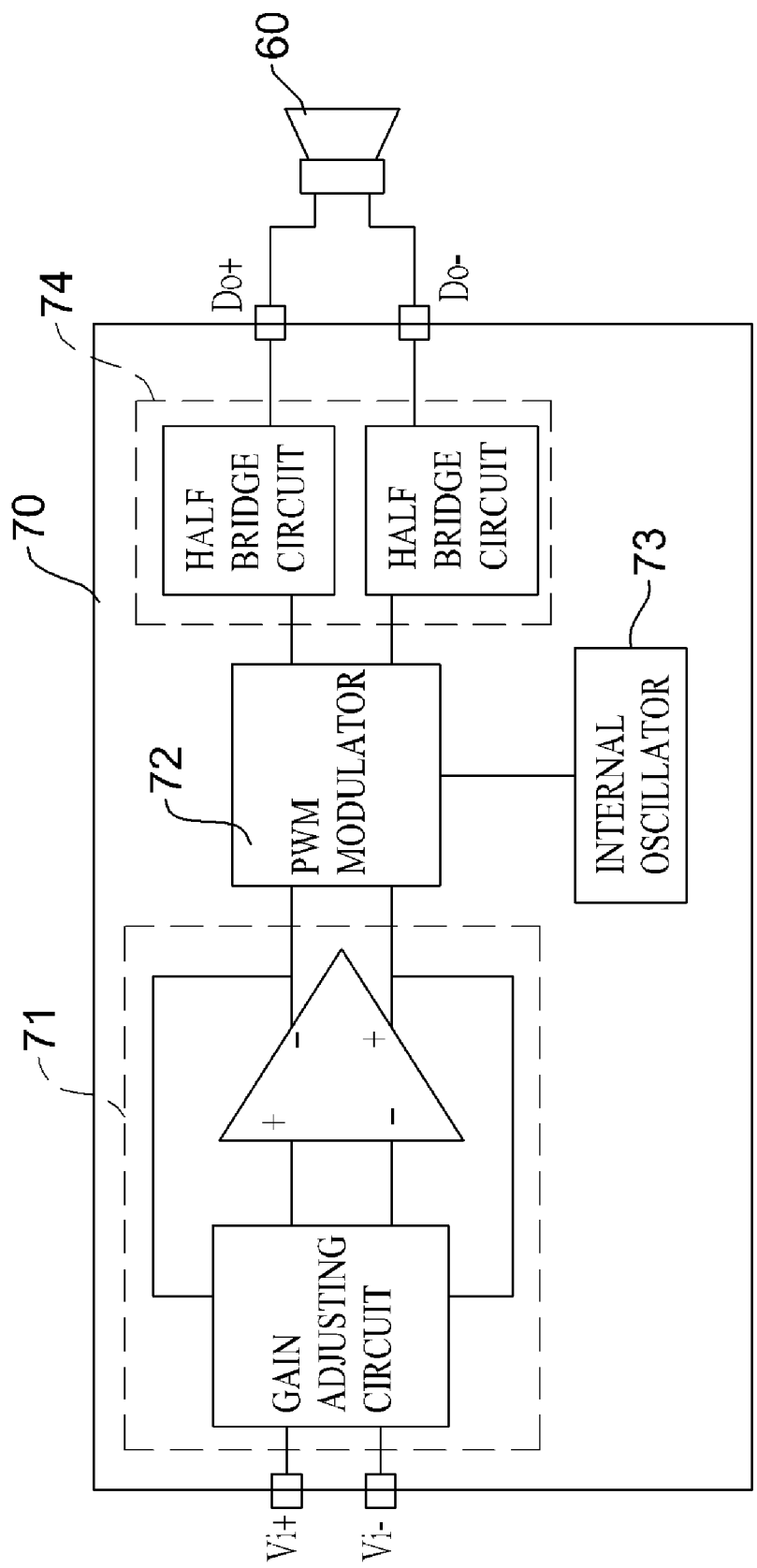
FIG. 5 is a circuit diagram of a conventional class-D amplifier with open loop circuit configuration.
Figure 6:
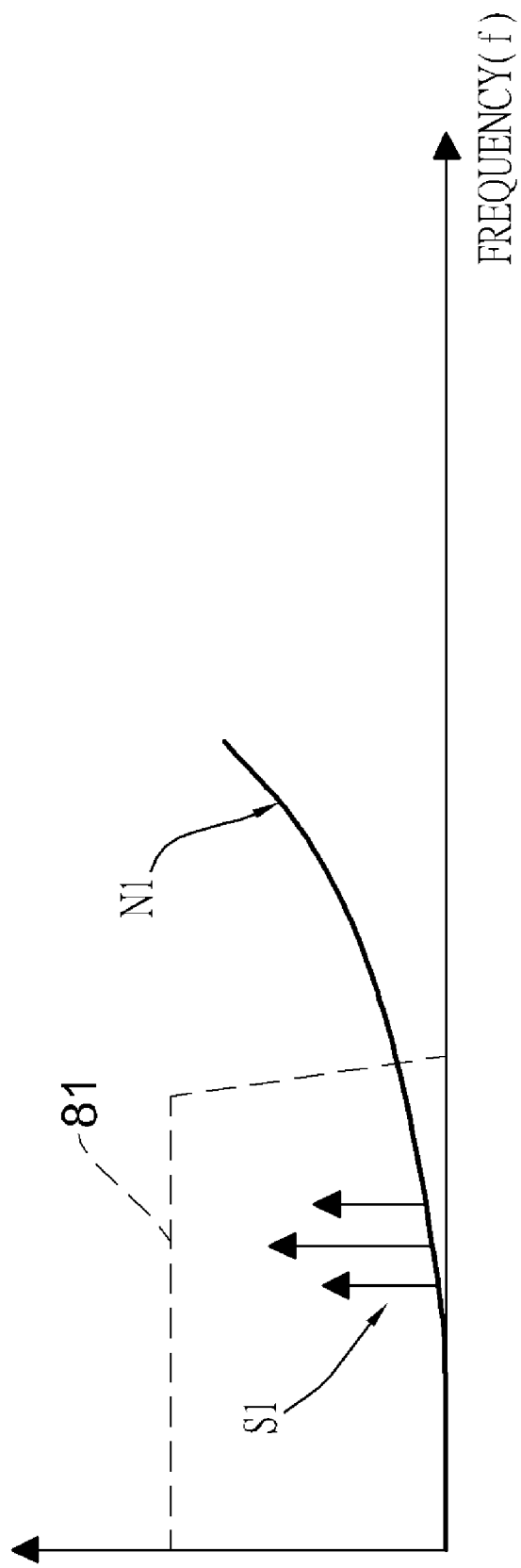
FIG. 6 is a diagram illustrating power spectrum of amplified audio signals output by the class-D amplifier of FIG. 5.
Figure 7:
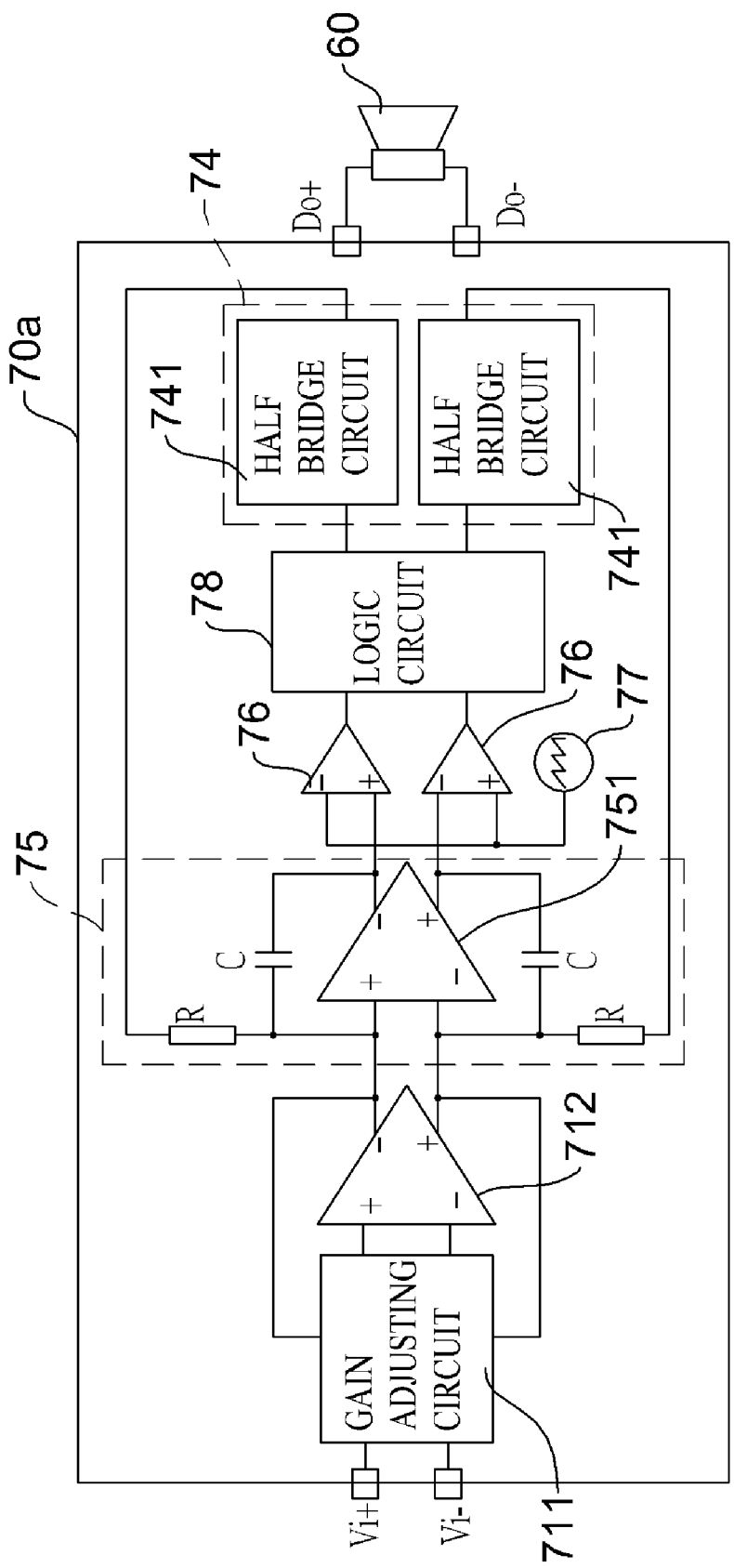
FIG. 7 is a circuit diagram of a conventional class-D amplifier with close loop circuit configuration.
Figure 8:
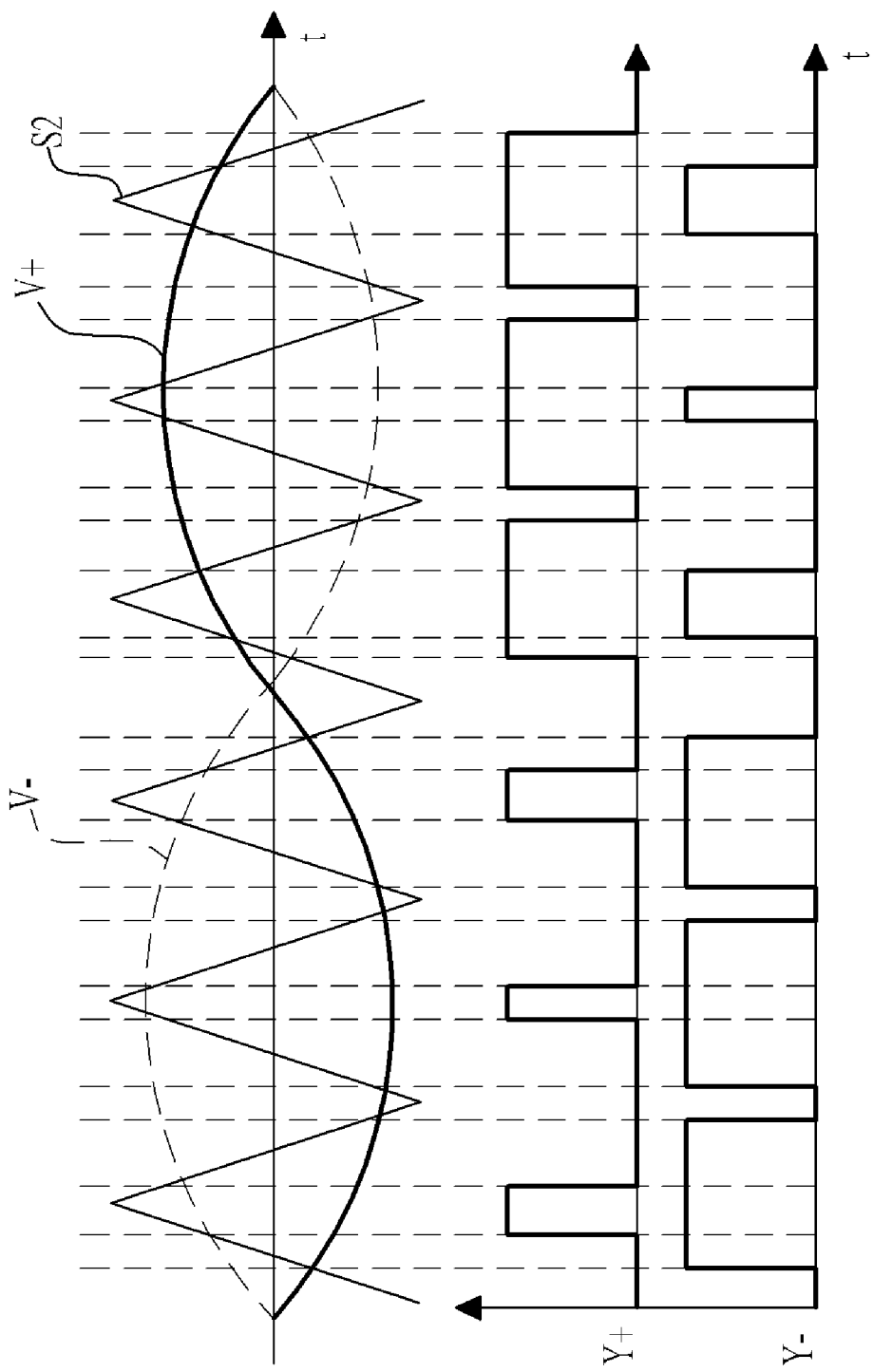
FIG. 8 is a waveform diagram illustrating signals of the class-D amplifier of FIG. 7.

With reference to FIG. 4, the noise shaping performance of the class-D amplifier with the dual feedback loop (N2) of the present invention is compared with the conventional class-D amplifier with the first-order feedback loop (N1). It can be seen that the noise floor in the signal band can be further reduced using the class-D amplifier of the present invention.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:
1. A class-D amplifier with dual feedback loop scheme comprising:
two differential output terminals;
a gain adjusting circuit;
two comparators;
an oscillator providing an oscillation signal;
a logic circuit connected to the two comparators and producing four asynchronous PWM signals X+, X−, Y+ and Y−,;
an output driver connected to the logic circuit, receiving the four asynchronous PWM signals X+, X−, Y+ and Y− and comprising
a first half bridge circuit comprising
a first sub-half bridge circuit including multiple high side switches and low side switches; and
a second sub-half bridge circuit including multiple high side switches and low side switches, wherein a number of the high side switches and low side switches of the first sub-half bridge circuit of the first half bridge circuit is more than that of the second sub-half bridge;
a second half bridge circuit comprising
a first sub-half bridge circuit including multiple high side switches and low side switches; and
a second sub-half bridge circuit including multiple high side switches and low side switches, wherein a number of the high side switches and low side switches of the first sub-half bridge of the second half bridge circuit is more than that of the second sub-half bridge;
wherein the first half bridge circuit and the second half bridge circuit are respectively connected to the two differential output terminals; and
a second-order integrator comprising:
a first differential amplifier having a non-inverting input, an inverting input, a non-inverting output and an inverting output, wherein the non-inverting input and the inverting input are connected to the gain adjusting circuit;
two first RC circuits cooperating with the first differential amplifier to form two first-order integrating circuits, wherein one of the first RC circuits is connected between one of the differential output terminals and the non-inverting input of the first differential amplifier, and the other first RC circuit is connected between the other differential output terminal and the inverting input of the first differential amplifier;
a second differential amplifier having a non-inverting input, an inverting input, a non-inverting output and an inverting output, wherein the non-inverting input of the second differential amplifier is connected to the non-inverting output of the first differential amplifier, and the inverting input of the second differential amplifier is connected to the inverting output of the first differential amplifier; and
two second RC circuits cooperating with the second differential amplifier to form two second-order integrating circuits, wherein one of the second RC circuits is connected between one of the differential output terminals and the non-inverting input of the second differential amplifier, and the other second RC circuit is connected between the other differential output terminal and the inverting input of the second differential amplifier.

2. The class-D amplifier as claimed in claim 1, wherein the two PWM signals X+ and X− correspond to the two first sub-half bridge circuits respectively, and the other two PWM signals Y+ and Y− correspond to the two second sub-half bridge circuits respectively, wherein the two PWM signals X+ and X− are expressed by X−=(Y−)-(Y+) and X+=(Y+)-(Y−).

3. The class-D amplifier as claimed in claim 2, wherein each of the second RC circuits includes a resistor that has two ends, one end is directly connected to one of the differential output terminals, and the other end is connected to the corresponding second differential amplifier.

* * * * *